(12) United States Patent
Tanaka et al.

(10) Patent No.: US 10,913,137 B2
(45) Date of Patent: Feb. 9, 2021

(54) METHOD FOR POLISHING SILICON WAFER

(71) Applicant: SHIN-ETSU HANDOTAI CO., LTD., Tokyo (JP)

(72) Inventors: Yuki Tanaka, Nishigo-mura (JP); Naoki Kamihama, Nishigo-mura (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 0 days.

(21) Appl. No.: 16/603,886

(22) PCT Filed: Mar. 16, 2018

(86) PCT No.: PCT/JP2018/010367
§ 371 (c)(1),
(2) Date: Oct. 9, 2019

(87) PCT Pub. No.: WO2018/198583
PCT Pub. Date: Nov. 1, 2018

(65) Prior Publication Data
US 2020/0114488 A1 Apr. 16, 2020

(30) Foreign Application Priority Data
Apr. 24, 2017 (JP) ................... 2017-085270

(51) Int. Cl.
*B24B 37/015* (2012.01)
*C09G 1/02* (2006.01)
(Continued)

(52) U.S. Cl.
CPC .......... *B24B 37/015* (2013.01); *C09G 1/02* (2013.01); *H01L 21/30625* (2013.01); *H01L 22/26* (2013.01)

(58) Field of Classification Search
CPC ... B24B 37/015; C09G 1/02; H01L 21/30625; H01L 22/26; H01L 21/02024; H01L 21/304
See application file for complete search history.

(56) References Cited

U.S. PATENT DOCUMENTS 5,352,328 A * 10/1994 Obeng .............. H01L 21/02052
134/902
5,885,334 A   3/1999 Suzuki et al.
(Continued)

FOREIGN PATENT DOCUMENTS

JP   H09-306881 A   11/1997
JP   2001-334454 A   12/2001
(Continued)

OTHER PUBLICATIONS

May 1, 2018 Search Report issued in International Patent Application No. PCT/JP2018/010367.

*Primary Examiner* — John P. Dulka
(74) *Attorney, Agent, or Firm* — Oliff PLC

(57) ABSTRACT

A method for polishing a silicon wafer, including: a first polishing step of polishing a silicon wafer surface by bringing the wafer held by a polishing head into sliding contact with a polishing pad attached to a turn table while supplying an aqueous alkaline solution containing abrasive grains onto the polishing pad, and a second polishing step of polishing the silicon wafer surface by bringing the wafer into sliding contact with the polishing pad while supplying an aqueous alkaline solution containing a polymer without containing abrasive grains onto the polishing pad, wherein the surface temperature of the polishing pad is controlled such that the surface temperature of the polishing pad in the second polishing step is higher than the surface temperature of the polishing pad in the first polishing step by 2° C. or more.

(Continued)

This successfully achieves both of higher flatness and reduction in surface roughness.

4 Claims, 2 Drawing Sheets

(51) Int. Cl.
  *H01L 21/306* (2006.01)
  *H01L 21/66* (2006.01)

(56) References Cited

U.S. PATENT DOCUMENTS

| | | | |
|---|---|---|---|
| 6,189,546 B1* | 2/2001 | Zhang | C09K 3/1463 134/1.3 |
| 6,611,060 B1* | 8/2003 | Toyoda | H01L 21/31053 257/758 |
| 2002/0002029 A1* | 1/2002 | Kimura | B24B 37/042 451/41 |
| 2003/0025200 A1* | 2/2003 | Katsumura | H01L 21/76802 257/734 |
| 2007/0093064 A1* | 4/2007 | Fukushima | B24B 37/015 438/692 |
| 2007/0224760 A1* | 9/2007 | Matsui | H01L 21/3212 438/257 |
| 2012/0156878 A1 | 6/2012 | Ogata et al. | |
| 2013/0032573 A1 | 2/2013 | Ogata et al. | |
| 2013/0260027 A1* | 10/2013 | Iiizumi | B24B 37/08 427/128 |
| 2014/0287656 A1 | 9/2014 | Schwandner | |
| 2016/0049355 A1* | 2/2016 | Howard | H01L 21/76898 257/621 |
| 2017/0178890 A1* | 6/2017 | Chu | B24B 37/20 |
| 2019/0131148 A1* | 5/2019 | Wu | H01L 21/67086 |
| 2020/0083057 A1* | 3/2020 | Yoshimura | B24B 9/065 |
| 2020/0090923 A1* | 3/2020 | Yamashita | H01L 21/02024 |
| 2020/0114488 A1* | 4/2020 | Tanaka | H01L 21/30625 |
| 2020/0198090 A1* | 6/2020 | Lee | B24B 37/015 |
| 2020/0306922 A1* | 10/2020 | Matsuda | B24B 37/34 |

FOREIGN PATENT DOCUMENTS

| | | |
|---|---|---|
| JP | 2011-042536 A | 3/2011 |
| JP | 2014-180753 A | 9/2014 |
| JP | 2016-204187 A | 12/2016 |
| WO | 2011/135949 A1 | 11/2011 |

* cited by examiner

METHOD FOR POLISHING SILICON WAFER

TECHNICAL FIELD

The present invention relates to a method for polishing a silicon wafer.

BACKGROUND ART

In recent years, semiconductor devices have been advanced remarkably toward miniaturization, weight reduction, and higher integration. Accordingly, wafers to constitute the matrix have been promoted to be higher in quality and larger in diameter such that some of them come to have a diameter of more than 300 mm, and demands for improving wafers in flatness and surface roughness get more and more strict.

The previous polishing have mainly been performed by a method using a polishing apparatus equipped with a turn table having a polishing pad attached thereto, a polishing head to hold a wafer from its back surface, and a nozzle to supply a slurry, in which method the wafer surface is brought into sliding contact with the polishing pad using the polishing head while rotating the turn table and the polishing head and supplying a slurry onto the polishing pad (see Patent Document 1).

Previously, polishing has been performed including the first stage to process a wafer precisely in flatness while supplying a slurry that contains abrasive grains, together with the second stage to process the wafer precisely in surface conditions (roughness, scratches, particles, etc.) while supplying a slurry that contains a polymer without containing abrasive grains. In these styles to perform polishing in a plurality of stages, the polishing conditions such as the rotation rate of the turn table and so on have always been constant.

CITATION LIST

Patent Literature

Patent Document 1: Japanese Unexamined Patent Application Publication No. 2001-334454

SUMMARY OF INVENTION

Technical Problem

The present inventors have researched on polishing including the first stage and the second stage described above to find that the ΔESFQRmax between before and after polishing is in a relation of trade-off to the surface roughness relating to the rotation rate of a turn table (FIG. 3). Incidentally, FIG. 3 is a graph showing the relative value of surface roughness (left axis) and the relative value of ΔESFQRmax (edge flatness, right axis) standardized on the basis of the values when the rotation rate of the turn table is triple-speed. Even in such a relation, the polishing technology is required to improve both of the properties.

The present invention was accomplished in view of the above-described issues. It is an object of the present invention to provide a method for polishing a silicon wafer that makes it possible to improve both of flatness and surface roughness.

Solution To Problem

To solve the issues described above, the present invention provides a method for polishing a silicon wafer, the method comprising:

a first polishing step of polishing a surface of the silicon wafer by bringing the silicon wafer held by a polishing head into sliding contact with a polishing pad attached to a turn table while supplying an aqueous alkaline solution containing an abrasive grain onto the polishing pad, and a second polishing step of polishing the surface of the silicon wafer by bringing the silicon wafer into sliding contact with the polishing pad while supplying an aqueous alkaline solution containing a polymer without containing an abrasive grain onto the polishing pad, wherein the polishing pad is controlled to have a surface temperature in such a way that the surface temperature of the polishing pad in the second polishing step is higher than the surface temperature of the polishing pad in the first polishing step by 2° C. or more to polish the silicon wafer.

It becomes possible to obtain a silicon wafer in which both of higher flatness and reduction in surface roughness are achieved by polishing with the surface temperature of the polishing pad being set higher in the second polishing step than in the first polishing step by 2° C. or more as described above.

It is preferable that the surface temperature of the polishing pad be controlled while measuring the surface temperature of the polishing pad by an infrared ray.

This makes it possible to control the surface temperature of the polishing pad more precisely.

In this case, it is preferable that the surface temperature of the polishing pad be controlled by adjusting at least one of a rotation rate of the turn table as well as a flow rate and a temperature of an aqueous coolant flowing into the turn table.

When the surface temperature of the polishing pad is controlled in such a way, it becomes possible to control the surface temperature easily so as to set the surface temperature of the polishing pad in the second polishing step higher than that of the polishing pad in the first polishing step by 2° C. or more.

Advantageous Effect of Invention

The inventive method for polishing a silicon wafer makes it possible to obtain a silicon wafer in which both of higher flatness and reduction in surface roughness have been achieved.

DESCRIPTION OF EMBODIMENTS

As described above, it has been required for a method for polishing a silicon wafer that can achieve both of higher flatness and reduction in surface roughness.

The present inventors have further investigated to find that the flatness is dominantly influenced by the polishing temperature in the first stage (the surface temperature of the polishing pad in the first polishing step), supplying an aqueous alkaline solution containing an abrasive grain only, and the surface roughness is dominantly influenced by the polishing temperature in the second stage (the surface temperature of the polishing pad in the second polishing step), supplying an aqueous alkaline solution containing a polymer only. Accordingly, the polishing conditions to achieve both of flatness and improvement in surface roughness are determined by polishing while monitoring the surface temperature of the polishing pad by infrared ray to set the surface temperature of the polishing pad in the second polishing step higher than the surface temperature of the polishing pad in the first polishing step for polishing.

Then the present inventors have found that both of higher flatness and reduction in surface roughness can be achieved by controlling the surface temperature of the polishing pad in the second polishing step to be higher than the surface temperature of the polishing pad in the first polishing step by 2° C. or more; thereby arriving at the present invention.

That is, the present invention provides a method of polishing a silicon wafer, the method comprising:

a first polishing step of polishing a surface of the silicon wafer by bringing the silicon wafer held by a polishing head into sliding contact with a polishing pad attached to a turn table while supplying an aqueous alkaline solution containing an abrasive grain onto the polishing pad, and a second polishing step of polishing the surface of the silicon wafer by bringing the silicon wafer into sliding contact with the polishing pad while supplying an aqueous alkaline solution containing a polymer without containing an abrasive grain onto the polishing pad, wherein the surface temperature of the polishing pad is controlled in such a way that the surface temperature of the polishing pad in the second polishing step is higher than the surface temperature of the polishing pad in the first polishing step by 2° C. or more to polish the silicon wafer.

Hereinafter, the method for polishing a silicon wafer will be described specifically.

Figure 2:
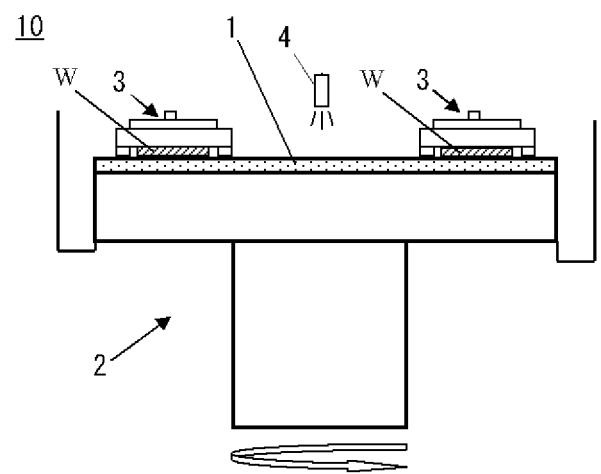
FIG. 2 is a schematic diagram showing an example of a single side polishing apparatus that can be used in the inventive method for polishing a silicon wafer.
Figure 3:
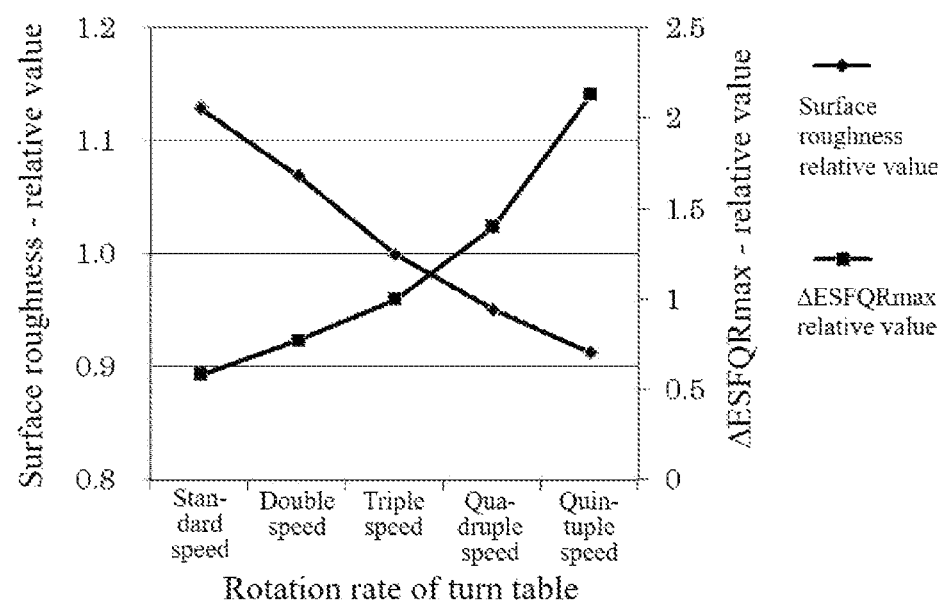
FIG. 3 is a graph showing the relationship of trade-off between ΔESFQRmax and surface roughness.

In the present invention, a single side polishing apparatus 10 may be used as shown in FIG. 2, equipped with a turn table 2 having a polishing pad 1 attached thereto, together with a polishing head 3 to hold a wafer W. This single side polishing apparatus 10 is configured to polish the surface of the wafer W by bringing the wafer W held by the polishing head 3 into sliding contact with the polishing pad 1 while supplying a polishing agent (slurry) from the nozzle 4 onto the polishing pad 1.

It is to be noted that the polishing apparatus used in the present invention is not limited to that of FIG. 2, which depicts an embodiment having two polishing heads 3 above one turn table. For example, one, three, or more polishing heads may be installed above one turn table. The number of turn table is not particularly limited too, and a plurality of turn tables may be installed.

As the polishing pad 1, a foamed urethane pad or a non-woven fabric is preferably used.

In the present invention, to begin with, the first polishing step is performed using such a single side polishing apparatus 10 to polish the surface of the silicon wafer W by bringing the silicon wafer W held by the polishing head 3 into sliding contact with the polishing pad 1 attached to the turn table 2 while supplying an aqueous alkaline solution containing an abrasive grain from the nozzle 4 onto the polishing pad.

As the polishing agent (slurry) in the first polishing step, an aqueous alkaline solution containing an abrasive grain is used. An illustrative example of the aqueous alkaline solution includes an aqueous KOH solution. As the abrasive grain, colloidal silica is preferable. Any aqueous alkaline solution containing an abrasive grain may be used, however, and the types of abrasive grain and aqueous alkaline solution are not limited thereto.

Then, the second polishing step is performed to polish the surface of the silicon wafer W by bringing the silicon wafer W into sliding contact with the polishing pad 1 while supplying an aqueous alkaline solution containing a polymer without containing an abrasive grain onto the polishing pad 1. The present invention is characterized by controlling the surface temperature of the polishing pad to polish a silicon wafer in such a way that the surface temperature of the polishing pad in the second polishing step is higher than the surface temperature of the polishing pad in the first polishing step by 2° C. or more (i.e., $\Delta T \geq 2°$ C. in FIG. 1). When the surface temperature of the polishing pad is controlled in this way, it is possible to achieve both of higher flatness and reduction in surface roughness.

The polishing agent used in the second polishing step is an aqueous alkaline solution containing a polymer without containing an abrasive grain (e.g., colloidal silica). Illustrative examples of the polymer include the one absorbed onto a wafer, such as hydroxyethyl cellulose. As the aqueous alkaline solution, aqueous ammonia may be exemplified. However, the types of the polymer and the aqueous alkaline solution are not limited thereto.

The surface temperature of the polishing pad is not particularly limited in the first polishing step and in the second polishing step if they are controlled in such a way that the surface temperature of the polishing pad in the second polishing step is higher than the surface temperature of the polishing pad in the first polishing step by 2° C. or more. For example, they can be a predetermined temperature in the range of 25 to 35° C. Each polishing time may be set to 2 to 8 minutes.

The surface temperature of the polishing pad is preferably controlled while measuring the surface temperature of the polishing pad by an infrared ray. This makes it possible to control the surface temperature of the polishing pad more precisely.

The method is not particularly limited for setting the surface temperature of the polishing pad in the second polishing step higher than the surface temperature of the polishing pad in the first polishing step by 2° C. or more. Specifically, the surface temperature of the polishing pad can be controlled by adjusting at least one of the rotation rate of the turn table as well as the flow rate and the temperature of an aqueous coolant flowing into the turn table while measuring the surface temperature of the polishing pad by an infrared ray. For example, the surface temperature of the polishing pad can be increased by 2° C. or more after finishing the first polishing step by increasing the rotation rate of the turn table to increase the friction heat, increasing the temperature of the aqueous coolant, or decreasing the flow rate of the aqueous coolant, which is flowing into the turn table. The transition time (for rising the temperature) from the first polishing step to the second polishing step may be 15 to 30 seconds, for example. As a method for setting the surface temperature of the polishing pad in the second polishing step higher than the surface temperature of the polishing pad in the first polishing step by 2° C. or more, it is also possible to adjust the flow rate or the temperature of the polishing agent to be supplied, the rotation rate of the polishing head, or the flow rate or the temperature of the aqueous coolant flowing into the polishing head. The surface temperature of the polishing pad can be controlled, however, more easily by adjusting the rotation rate of the turn table to which the polishing pad is attached or the aqueous coolant flowing into the turn table.

When the surface temperature of the polishing pad in the second polishing step is lower than the surface temperature of the polishing pad in the first polishing step, or when the difference is less than 2° C. between the surface temperature of the polishing pad in the second polishing step and the surface temperature of the polishing pad in the first polishing step, it becomes impossible to achieve both of higher flatness and reduction in surface roughness.

EXAMPLES

Hereinafter, the present invention will be more specifically described by showing Examples and Comparative Examples, but the present invention is not limited to these Examples.

Examples 1 to 2, Comparative Examples 1 to 3

The single side polishing apparatus 10 as shown in FIG. 2 was used for polishing the surface of the wafer W by bringing the wafer held by the polishing head 3 into sliding contact with the polishing pad 1 attached to the turn table 2 while supplying a slurry from the nozzle 4 onto the polishing pad 1. As the polishing pad 1, a non-woven fabric was used. As the polishing slurry, an aqueous KOH solution containing colloidal silica was used in the first polishing step, and an aqueous ammonia solution containing hydroxyethyl cellulose (HEC) with the molecular weight of 1,000,000 was used in the second polishing step.

Figure 1:
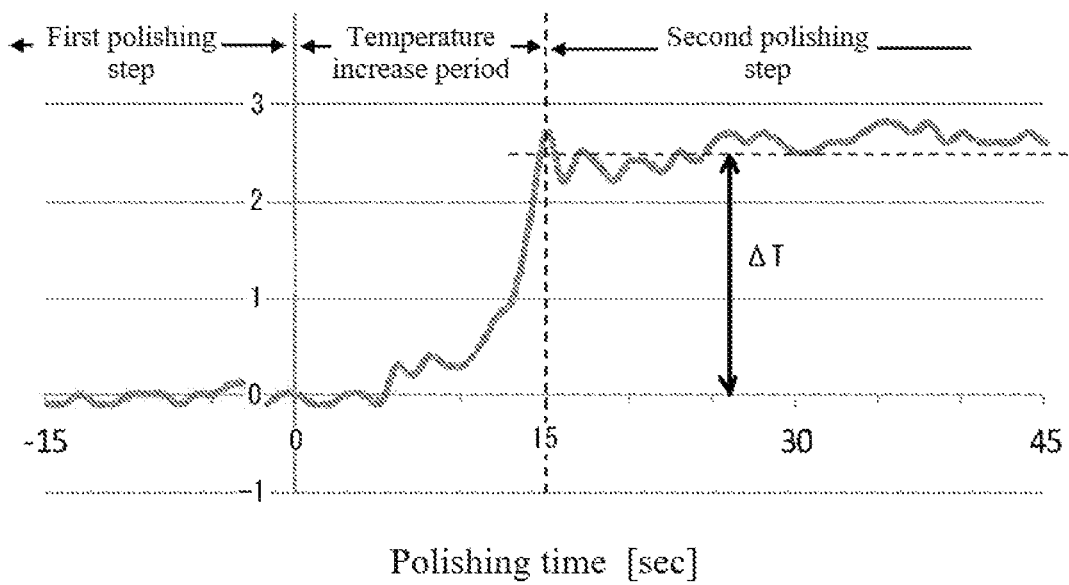
FIG. 1 is a graph showing change in surface temperature of the polishing pad in Examples 1 and 2.

As shown in FIG. 1, a silicon wafer was polished while supplying an aqueous KOH solution containing colloidal silica (the first polishing step); followed by stoppage of the flow of aqueous coolant for the turn table simultaneously with starting to supply an aqueous ammonia solution containing HEC with the molecular weight of 1,000,000, together with an increase of the rotation rate of the turn table in 15 sec (temperature increasing period); and the second polishing step was performed at a rotation rate, which is a value relative to the rotation rate of the turn table in the first polishing step, shown in Table 1. The surface temperature of the polishing pad had been measured by an infrared ray during the polishing. Table 1 shows the difference between the average temperatures (ΔT) in the first polishing step and in the second polishing step.

Table 1 shows the temperature difference between the first polishing step and the second polishing step, together with corresponding ΔESFQRmax and the surface roughness measured by using TMS-3000W (manufactured by Schmitt Industries Inc.). The edge flatness was measured by using Wafer Sight manufactured by KLA Tencor Corporation. In calculating the ESFQRmax, zones (another name: Polar Sites) were set to M49 mode with the total sector number of 72 and the sector length of 30 mm (2 mm E.E. (outer circumferential exclusion area)). The ΔESFQRmax represents a difference between before and after polishing.

TABLE 1

|  | Comparative Example 1 | Comparative Example 2 | Comparative Example 3 | Example 1 | Example 2 |
|---|---|---|---|---|---|
| Difference of average temperature | 0.3° C. | 1.4° C. | 1.8° C. | 2.0° C. | 2.6° C. |
| Surface roughness *[1] | 1.67 | 1.27 | 1.08 | 0.93 | 0.79 |

TABLE 1-continued

|  | Comparative Example 1 | Comparative Example 2 | Comparative Example 3 | Example 1 | Example 2 |
|---|---|---|---|---|---|
| Flatness *[1] (ΔESFQRmax) | 0.73 | 0.78 | 0.83 | 0.88 | 0.83 |
| Rotation rate of turn table in second polishing step *[2] | 1.0 | 1.6 | 2.2 | 2.8 | 3.5 |
| Succeeded in | Flatness only | Flatness only | Flatness only | Both | Both |

*[1] relative value when the standardized value is set to 1
*[2] relative value when the rotation rate of the turn table in the first polishing step is set to 1

As shown in Table 1, Examples 1 and 2, in which each surface temperature of the polishing pad in the second polishing step was controlled to be higher than the surface temperature of the polishing pad in the first polishing step by 2° C. or more, succeeded in both of flatness and surface roughness to achieve the standards. On the other hand, Comparative Examples 1 to 3 failed to achieve the standard in surface roughness, thereby failing to satisfy both of flatness and surface roughness.

It is to be noted that the present invention is not restricted to the foregoing embodiment. The foregoing embodiment is just an illustrative example, and any example that has substantially the same configuration and exercises the same functions and effects as the technical concept described in claims is included in the technical scope of the present invention.

The invention claimed is:

1. A method for polishing a silicon wafer, the method comprising:
   a first polishing step of polishing a surface of the silicon wafer by bringing the silicon wafer held by a polishing head into sliding contact with a polishing pad attached to a turn table while supplying an aqueous alkaline solution containing an abrasive grain onto the polishing pad, and
   a second polishing step of polishing the surface of the silicon wafer by bringing the silicon wafer into sliding contact with the polishing pad while supplying an aqueous alkaline solution containing a polymer without containing an abrasive grain onto the polishing pad,
   wherein the polishing pad is controlled to have a surface temperature in such a way that the surface temperature of the polishing pad in the second polishing step is higher than the surface temperature of the polishing pad in the first polishing step by 2° C. or more to polish the silicon wafer.

2. The method for polishing the silicon wafer according to claim 1, wherein the surface temperature of the polishing pad is controlled while measuring the surface temperature of the polishing pad by an infrared ray.

3. The method for polishing the silicon wafer according to claim 1, wherein the surface temperature of the polishing pad is controlled by adjusting at least one of a rotation rate of the turn table as well as a flow rate and a temperature of an aqueous coolant flowing into the turn table.

4. The method for polishing the silicon wafer according to claim 2, wherein the surface temperature of the polishing pad is controlled by adjusting at least one of a rotation rate of the turn table as well as a flow rate and a temperature of an aqueous coolant flowing into the turn table.

* * * * *